US005157576A

United States Patent [19]

Takaya et al.

[11] Patent Number: 5,157,576

[45] Date of Patent: Oct. 20, 1992

[54] COMPOSITE ELECTRIC PART OF STACKED MULTI-LAYER STRUCTURE

[75] Inventors: Minoru Takaya, Ichikawa; Katsuharu Yasuda, Tokyo, both of Japan

[73] Assignee: TDK Corporation, Tokyo, Japan

[21] Appl. No.: 657,699

[22] Filed: Feb. 19, 1991

[30] Foreign Application Priority Data

Feb. 20, 1990 [JP] Japan .................................. 2-38767

[51] Int. Cl.⁵ ....................... H01G 4/10; H01L 27/02; H03H 7/075

[52] U.S. Cl. .................................. 361/321; 357/51 L; 333/185

[58] Field of Search ...................... 361/321; 357/51 L; 336/181, 200, 232; 333/185

[56] References Cited

U.S. PATENT DOCUMENTS 4,012,703 3/1977 Chamberlayne .................... 336/200
4,613,843 9/1986 Esper et al. ......................... 336/232
4,959,631 9/1990 Hasegawa et al. .................. 336/323
5,034,710 7/1991 Kawaguchi ......................... 333/185

*Primary Examiner*—Donald Griffin
*Attorney, Agent, or Firm*—Seidel, Gonda, Lavorgna & Monaco

[57] ABSTRACT

A composite electric part of a stacked multi-layer structure is composed of a capacor layer and a coil layer. The coil layer comprises a plurality of coils buried in a magnetic material. At least one of the coils includes a plurality of coil conductors which comprises combinations each of two coil conductors would spirally in opposite directions around respective winding axes extending substantially coaxially with each other, and mutually connected such that magnetic fields are generated in a same direction by the two coil conductors. A miniature size of composite electric part exhibiting a high inductance value is realized.

2 Claims, 13 Drawing Sheets

COMPOSITE ELECTRIC PART OF STACKED MULTI-LAYER STRUCTURE

BACKGROUND OF THE INVENTION

1. Field of the Invention

The present invention relates generally to a composite electric part of a stacked multi-layer structure, and more particularly to an electric part of a composite structure which incorporates coils and capacitors implemented in a stacked or laminated multi-layer configuration.

2. Description of the Prior Art

In manufacturing of a composite electric part of the stacked multi-layer structure type mentioned above, the capacitor layers can be realized in an integrated structure relatively easily by resorting to a stacked-layer capacitor manufacturing technique known heretofore. However, difficulty is often encountered in implementing the coil layers in an integrally stacked structure. The techniques which can be utilized to this end are limited, although several proposals have heretobefore been made, as typified by the one disclosed in Japanese Patent Publication No. 39521/1982.

According to the technique disclosed in the above-mentioned publication, magnetic layers of a ferrite material and electric conductors constituting a coil are stacked alternately by employing a printing process, which is then followed by sintering the stacked layer structure thus formed at a high temperature. In practice, for implementing the stacked layer structure, such a method is commonly adopted which comprises a step of forming by printing a film conductor of a length corresponding to about a half-turn of the coil on a substrate, a step of applying a magnetic film thereon with end portions of the conductor being exposed, and a step of printing a film conductor corresponding to the remaining half-turn on the magnetic layer in such manner that an electric connection is made to the first mentioned conductor. The steps mentioned above are repeated until a coil having a desired number of turns has been realized, whereby the coil structure composed of a magnetic material and windings wound helically in the stacking direction at a predetermined pitch is formed. By sintering the stacked layer structure thus formed, there can be obtained an integrated multi-layer coil structure incorporating the coil embedded or buried in the magnetic material at a high integration density. By integrating the stacked layer coil with a capacitor of a stacked layer structure manufactured through a similar process, there can finally be realized a composite electric part of a stacked layer structure in a miniature size with a high integration density and capable of exhibiting high performance.

The composite electric part of the stacked multi-layer structure (hereinafter also referred to simply as the multi-layer composite electric part) finds a variety of numerous applications such as for implementations of trap elements, low-pass filters, high-pass filters, band-pass filters, equalizers, IFTs and the like. Accordingly, values of capacitance and inductance of the multi-layer composite electric part as well as network configuration of the capacitors and the coils has to be susceptible to selection over a wide range. In this connection, it is noted that the value and the network configuration of the capacitor can easily be adjusted over a wide range by selecting appropriately the number of the stacked layers, the number of electrodes or plates, manner of interconnection and other factors.

In contrast, in the case of an inductor structure manufactured by the layer stacking method disclosed in, for example, Japanese Patent Publication No. 39521/1982, the value of inductance is necessarily determined in dependence on the number of the stacked layers because of the three-dimensional structure is which the coil conductors are disposed in continuation to one another in the directions in which the layers are stacked. Accordingly, for selecting the inductance value or more particularly for increasing that value, the number of the layers has to be increased correspondingly. Consequently, as the inductance value increases, the number of the layers to be stacked is also increased correspondingly, which results in an increased overall thickness of the stacked coil structure in contradiction to the demand for a miniaturized thin structure.

In conjuction with the selective determination of the inductance value, it is conceivable to form a plurality of coil conductors individually, wherein the conductors are connected in series exteriorly of the coil structure. In that case, however, the sectional area occupied by one coil will be increased, resulting in a correspondingly enlarged size.

As another example of the stacked layer coil, there has also been proposed such a coil structure in which a plurality of individual spiral coil conductors wound with a pitch in a same direction are embedded in axial juxtaposition within a body of a magnetic material. With such coil structure, however, the leading end and the trailing end of each of the plural coil conductors are disposed in the same direction. By way of example, when the leading end of each coil conductor assumes a position beneath the magnetic layer, then the trailing end thereof is positioned on the top thereof. Accordingly, for connecting the coil conductors such that magnetic fields are generated in a same direction, the trailing end of the coil conductor located at the top of the magnetic layer has to be led out and connected to the leading end of the other coil conductor located at the bottom. It is however impossible to realize such electric connection interiorly of the magnetic material. It is indispensably required to lead out the leading and trailing ends of the top and bottom coil conductors exteriorly of the magnetic material and connect them by using external terminals or the like. Consequently, interconnection of the individual coil conductors requires much complicated procedure, involving an increased number of manufacturing steps, not to say of undesirableness from the viewpoint of the characteristics of the coil.

SUMMARY OF THE INVENTION

Accordingly, it is an object of the present invention to eliminate the problems of the prior art coil mentioned above and provide a multi-layer composite electric part which can enjoy a high integration density and high performance and in which a coil can be constituted by a plurality of coil conductors formed consecutively and interiorly in a magnetic material with an increased number of turns and thus can exhibit an increased inductance value without need for increasing appreciably the space occupied by the coil.

In view of the above and other objects which will become apparent as description proceeds, there is provided according to an aspect of the present invention a composite electric part of a stacked multi-layer structure composed of a capacitor layer and a coil layer, wherein the coil layer comprises one or a plurality of coils buried in a magnetic material, and wherein at least one of the coils includes a plurality of coil conductors which comprises combinations each of two coil conductors wound spirally in opposite directions around respective winding axes extending substantially coaxially with each other, respectively, and connected to each other such that magnetic fields are generated in a same direction by said two coil conductors.

With the structure of the coil mentioned above in which the plurality of coil conductors constituting the coil are connected to one another such that magnetic fields of a same direction are thereby generated, the number of turns of the whole coil corresponds to a sum of the numbers of turns formed by the plurality of the coil conductors. In general, inductance value L(H) of a coil is given by $$L=4\pi\mu_e\cdot(A/l)\cdot N^2\times10^{-9}$$

where

A represents a sectional area ($m^2$) of a turn or winding defined by the coil conductors, l represents a length of magnetic path (m), $\mu_e$ represents an effective permeability ($W_b$/ A·m), and N represents the number of turns.

It is thus apparent that according to the teachings of the present invention, an extremely large inductance value L can be realized because the number of turns of the whole coil corresponds to a sum of the numbers of turns formed by the plural coil conductors.

The individual coil conductors are wound spirally in the directions opposite to each other around the respective axes extending substantially coaxially, as a result of which there is realized an integrated structure in which the individual coil conductors are stacked one atop another at substantially same positions or locations. Consequently, the space occupied by the coil conductors and hence by the coil itself is significantly decreased. In this manner, there can be realized a composite electric part of a stacked multi-layer structure which incorporates the coil capable of exhibiting a high inductance value notwithstanding of implementation in a miniature size with a reduced thickness.

It should additionally be mentioned that because the plurality of coil conductors include combinations each of two coil conductors wound oppositely to each other as viewed in a direction along a general winding axis, connection of the trailing end of one coil conductor to the leading end of the other coil conductor allows an electric current to flow through the coil in a same direction. Further, since the trailing end portion of one coil conductor is positioned in the same direction or orientation as the leading end portion of the other conductor, continuous connection of both coil conductors within the magnetic material can be realized extremely easily.

The coil incorporated in the coil layer can be used not only as an inductor bùt also as parts of a transformer.

BRIEF DESCRIPTION OF THE DRAWINGS

The invention will become more apparent by reading the following detail description in conjunction with the preferred embodiments thereof which are shown, by way of example only, in the accompanying drawings, wherein.

DETAILED DESCRIPTION OF THE PREFERRED EMBODIMENTS

Now, the present invention will be described in detail in conjunction with preferred or exemplary embodiments thereof by reference to the accompanying drawings.

Figure 1:
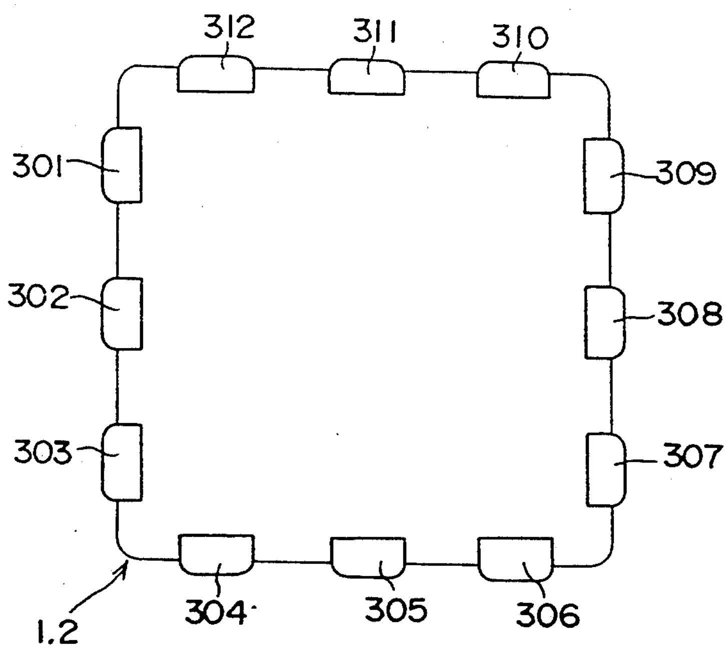
FIG. 1 is a plan view of a composite electric part of a stacked multi-layer structure according to an embodiment of the present invention.
Figure 2:
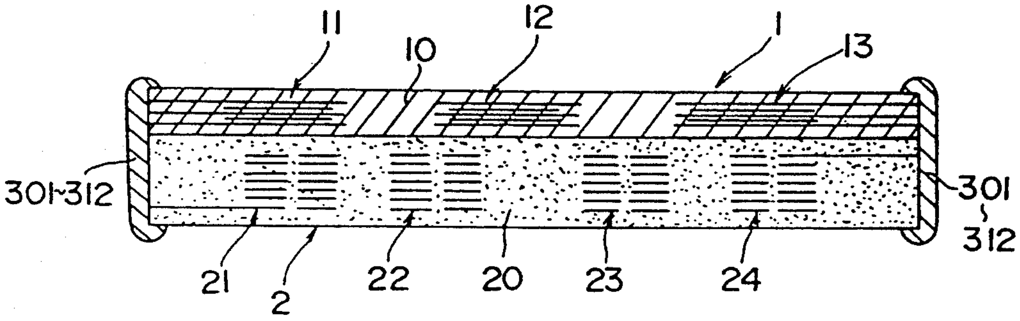
FIG. 2 is a sectional view of the same for illustrating a stacked multi-layer structure.

FIG. 1 is a plan view showing, by way of example, a composite electric part of a stacked multi-layer structure according to an embodiment of the present invention and FIG. 2 is a sectional view for illustrating the stacked multi-layer structure. In these figures, reference numeral 1 denotes generally a capacitor layer, 2 denotes a coil layer, and reference numerals 301 to 312 denote terminal electrodes, respectively.

The capacitor layer 1 is implemented in such a structure in which capacitor networks 11 to 13 are buried or embedded internally within a dielectric ceramic material 10. Each of the capacitor networks 11 to 13 is realized by interconnecting in a desired circuit configuration the individual capacitor elements each of which is formed by disposing electrodes in opposition to each other with a dielectric ceramic layer being interposed therebetween. The circuit configurations of the capacitor networks 11 to 13 can be selected arbitrarily by taking into account the applications for which they are intended. These capacitor networks 11 to 13 are connected to given ones of the terminal electrodes 301 to 312 to be led externally.

Figure 3:
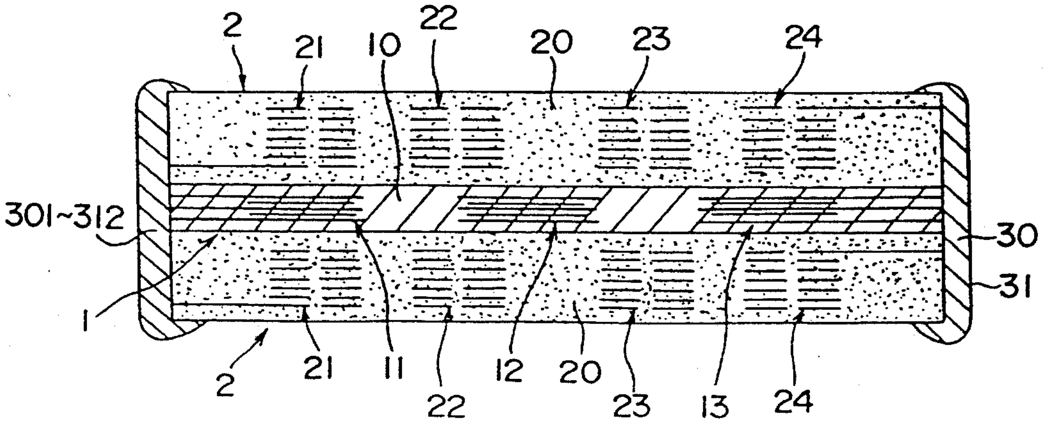
FIG. 3 is a sectional view showing a stacked multilayer stacked structure of a composite electric part according to another embodiment of the invention.

The coil layer 2 is integrally stacked onto the capacitor layer 1 by resorting to suitable means such as sintering or bonding. In the case of the structure of the exemplary embodiment shown in FIG. 2, the coil layer 2 is stacked on and over one surface of the capacitor layer 1. It should however be noted that a pair of coil layers 2 may be laminated over both surfaces of the capacitor layer 1, as shown in FIG. 3. Alternatively, such a structure can of course be adopted in which a pair of capacitor layers 1 are stacked on both surfaces of the coil layer 2, although not shown in the drawing. The coil layer 2 can be implemented in such a structure in which coils 21 to 24 are embedded or buried in a magnetic material 20 such as ferrite or the like. The number of the coils 21 to 24 as well as the numbers of turns thereof may arbitrarily be selected in accordance with a circuit configuration to be implemented.

Figure 4:
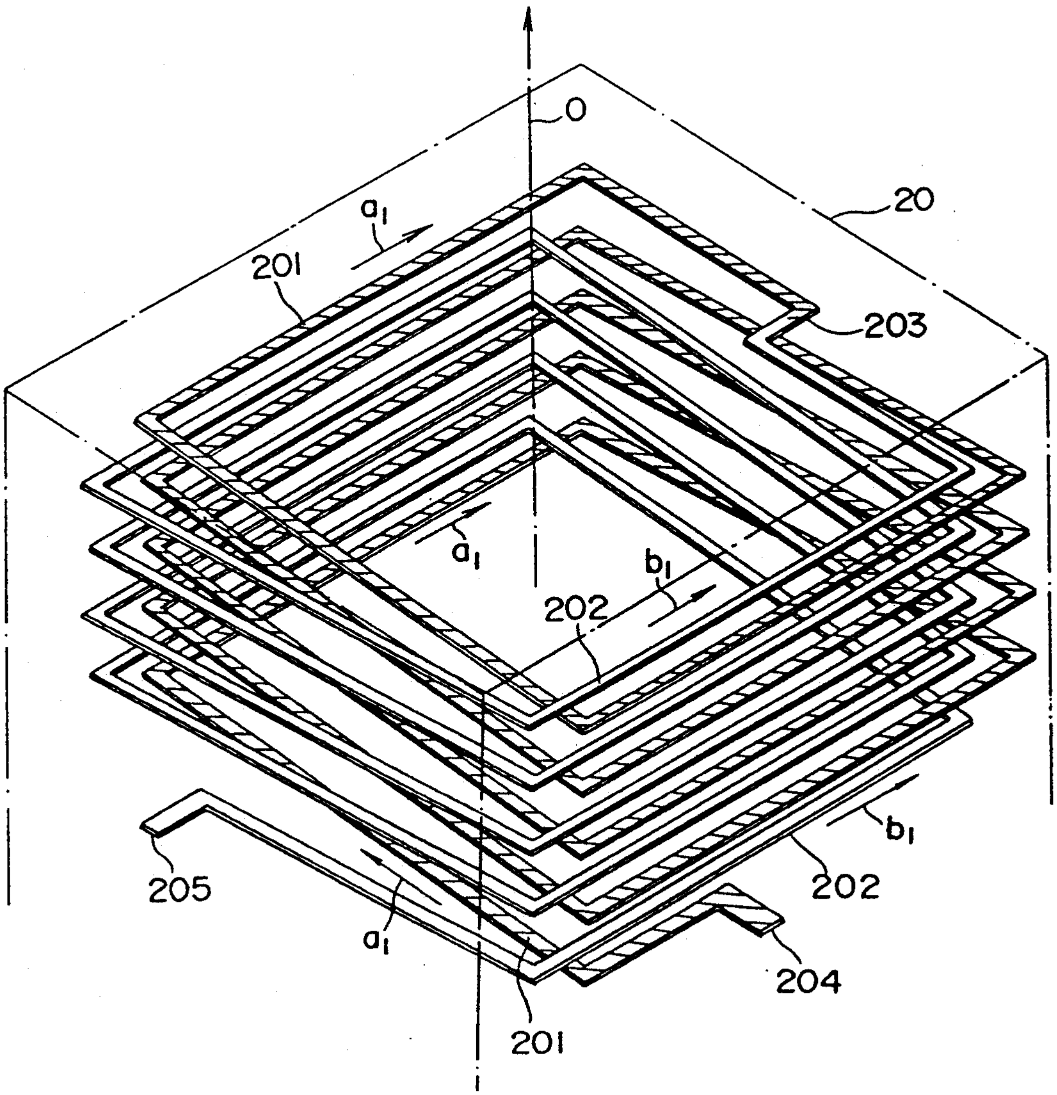
FIG. 4 is a perspective view of a coil to be incorporated in a composite electric part according to a further embodiment of the invention.
Figure 5:
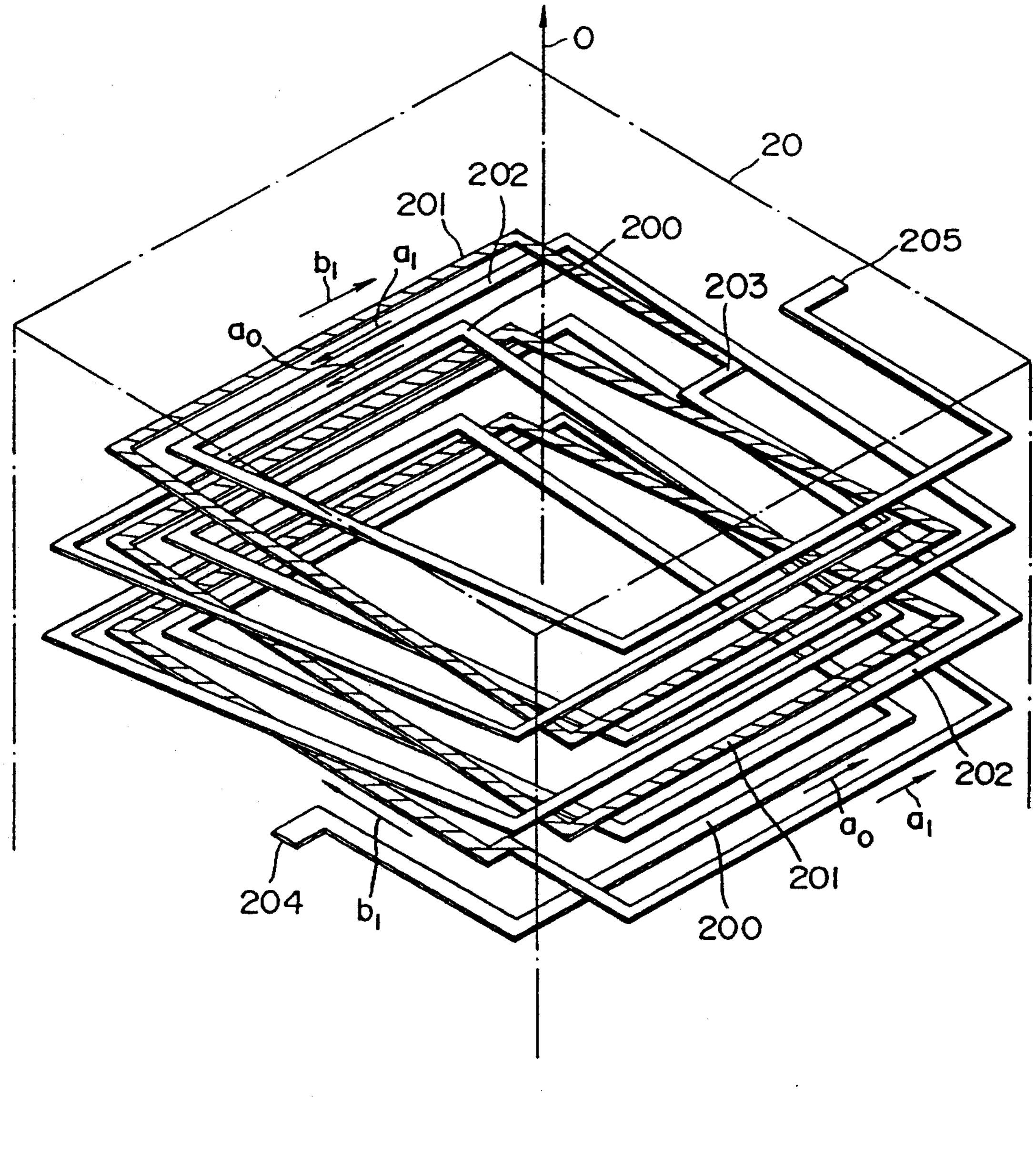
FIG. 5 is a perspective view showing another embodiment of the coil according to the invention.

FIGS. 4 and 5 are pictorial views each illustrating in the form of a model a structure which is to be imparted to at least one of the coils 21 to 24. In the case of the exemplary structure illustrated in FIG. 4, at least one of the coils 21 to 24 includes two electric coil conductors 201 and 202. In FIG. 4, reference numeral 203 denotes a connecting portion at which the coil conductors 201 and 202 are connected to each other and numerals 204 and 205 denote terminals, respectively.

The coil conductors 201 and 202 are wound such that turns or windings thereof follow helical paths around respective winding axes O, which are substantially coincident with each other (i.e. the winding axis of the coil conductor 201 extends through a space defined by the windings or turns of the coil conductor 202 and vice versa). For this reason, only a single general winding axis O is shown in the drawing.

It should further be noted that the winding direction $a_1$ of the coil conductor 201 is opposite to the winding direction $b_1$ of the coil conductor 202 as viewed in the direction in which the general winding axis O extends. In other words, the winding direction $a_1$ of the coil conductor 201 is counterclockwise while the winding direction $b_1$ of the coil conductor 202 is clockwise as viewed with reference to the direction of the general winding axis O.

The coil conductors 201 and 202 are connected to each other by the connecting portion 203 such that magnetic fields of the same direction are generated by both the coil conductors 201 and 202 under the action of a current when it flows through these coil conductors. As a concrete example of such connection, the trailing end of the coil conductor 201 and the leading end of the coil conductor 202 may be connected to each other through the connecting portion 203. Since the winding direction $a_1$ of the coil conductor 201 is opposite to that $b_1$ of the coil conductor 202 as viewed in the direction along the general winding axis O, there can be realized a coil structure by the coil conductors 201 and 202 in which the current flows in the same direction by connecting mutually the trailing end of the former and the leading end of the latter at the connecting portion 203. The terminal portions 204 and 205 are connected, respectively, to given ones of the terminal electrodes 301 to 312 shown in FIGS. 1 and 2.

Upon application of a current to the coil structure including the coil conductors 201 and 202 wound and connected in the manner described above, the current flows in a same direction around the general winding axis O, as a result of which magnetic fields of a same direction are generated. Accordingly, inductance value L(H) of the whole coil structure or assembly is approximately four times as high as that of the coil structure formed of the single coil conductor on the assumption that the numbers $n_1$ and $n_2$ of turns of the coil conductors 201 and 202 are substantially equal to each other.

By virtue of the helical winding of the coil conductors 201 and 202 with a same pitch around the substantially same winding axis O (i.e. the axis positioned substantially in common to both the coil conductors 201 and 202), there can be realized a coil structure of a much reduced size which requires only a small space for the amount thereof.

As described above, the winding directions $a_1$ and $b_1$ of the coil conductors 201 and 202 are opposite to each other as viewed in the direction along the winding axis O. Consequently, the trailing end portion of the coil conductor 201 and the leading end portion of the coil conductor 202 are oriented or positioned at a same level in a coplanar relation to each other and thus can be interconnected straightforwardly at this position through the connecting portion 203. As a result of this, both coil conductors 201 and 202 can be interconnected interiorly of the magnetic material 20 without need for leading outwardly these coil conductors 201 and 202 for the purpose of interconnection. This in turn means that the interconnecting structure for the coil conductors 201 and 202 can be much simplified with the connecting procedure being extremely facilitated.

By decreasing the thickness of the magnetic layers interposed between the turns of the coil conductors 201 and 202, there can be obtained a stacked layer coil structure which can exhibit a high inductance value without need for increasing the whole thickness of the coil structure to any appreciable extent.

Referring to FIG. 5, there is shown a coil structure according to another embodiment of the invention. This coil structure comprises three coil conductors 200, 201 and 202 which are helically wound around respective winding axes which substantially coincide with one another. For this reason, only one general winding axis O is shown in FIG. 5.

In the case of the instant embodiment, the winding direction $a_o$ of the coil conductor 200 is opposite to that $b_1$ of the coil conductor 201 while the winding direction $b_1$ of the coil conductor 201 is opposite to that $a_1$ of the coil conductor 202, as viewed in the direction along the general winding axis O.

These coil conductors 200, 201 and 202 are so connected to one another that magnetic fields of one and the same direction are produced by the current flowing though the coil realized by interconnecting these coil conductors 200, 201 and 202. To this end, the trailing end of the coil conductor 200 is connected to the leading end of the coil conductor 201 through a connecting portion 203 while the trailing end of the coil conductor 201 is connected to the leading end of the coil conductor 202 through a connecting portion 203.

Since the inductance value L(H) of the coil structure thus realized is approximately in proportion to a square of a sum of the numbers of turns $n_o$, $n_1$ and $n_2$ of the coil conductors 200, 201 and 202, respectively, the coil according to the instant embodiment can assure a higher inductance value than that of the coil structure shown in FIG. 4.

Also in the case of the instant embodiment, the coil conductors 201 and 202 are wound helically, wherein the respective winding axes of the coil conductors 201 and 202 are substantially coincident with each other, as defined hereinbefore in conjunction with the embodiment shown in FIG. 4. Thus, there can be obtained a composite electric part of a stacked multi-layer structure incorporating a coil capable of exhibiting a high inductance value notwithstanding its a reduced size.

Furthermore, since the winding direction $a_o$ of the coil conductor 200 is opposite to the winding direction $b_1$ of the coil conductor 201 with the latter being opposite to the winding direction $a_1$ of the coil conductor 202, as viewed in the direction along the axis O, the trailing end of the coil conductor 200 and the leading end of the coil conductor 201 make appearance at a same level in a coplanar relation to each other. The same holds true for the trailing end of the coil conductor 201 and the leading end of the coil conductor 202. Thus, when the coil conductors 200, 201 and 202 are to be interconnected such that magnetic fields of a same direction can be generated by them, the connecting portions 203 to this end can be disposed interiorly of the magnetic material for interconnection of the coil conductors mentioned above.

Since it will be self-explanatory from the above description to those skilled in the art to implement coil combinations or structures including a greater number of the coil conductors, any further description of these modifications will be unnecessary.

Figure 6:
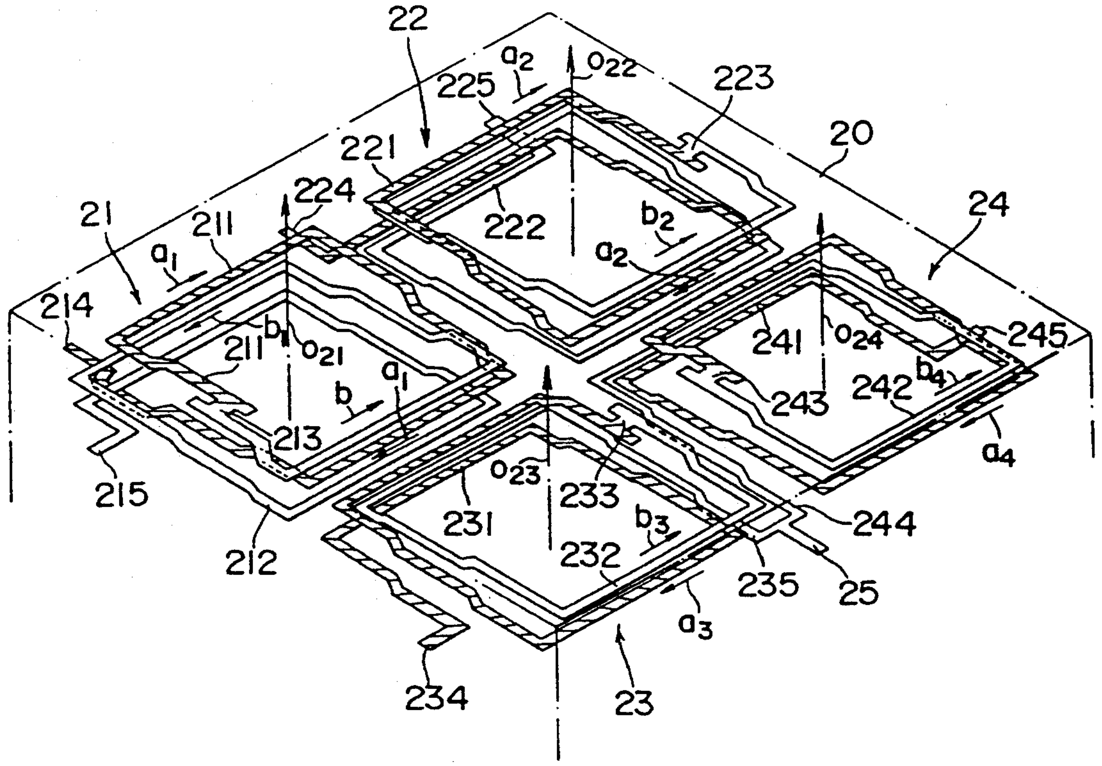
FIGS. 6 and 7 are perspective views showing coil assemblies according to further embodiments of the invention, respectively.

Next, referring to FIG. 6, description will be made of an exemplary embodiment of the invention which is directed to a manufacturing process. The coil assembly according to the embodiment illustrated in FIG. 6 is composed of coils each of the structure which corresponds to that described above by reference to FIG. 4. More specifically, the coils 21 to 24 include pairs of coil conductors 211; 212, . . . , 241; 242, respectively. Considering the coil conductors 211 and 212, by way of example, they are wound helically around the respective axes which substantially coincide with each other in the winding axis direction $O_{21}$. Further, the winding direction $a_1$ of the coil conductor 211 is opposite to that $b_1$ of the coil conductor 212 as viewed in the winding axis direction $O_{21}$.

The coil conductors 211 and 212 are connected to each other through a connecting portion 213 such that magnetic fields of a same direction are generated by them. In FIG. 6, reference numerals 214 and 215 denote terminals which are connected to given ones of the terminal electrodes 301 to 312 shown in FIGS. 1 and 2. It should however be appreciated that the terminal members 214 and 215 may be connected together, wherein the portion connected through the connecting portion 312 may be disconnected or separated to thereby form these terminal members. Besides, the connecting portion 213 may be used as the leading end with the other coil conductor being stacked thereon.

Figure 7:
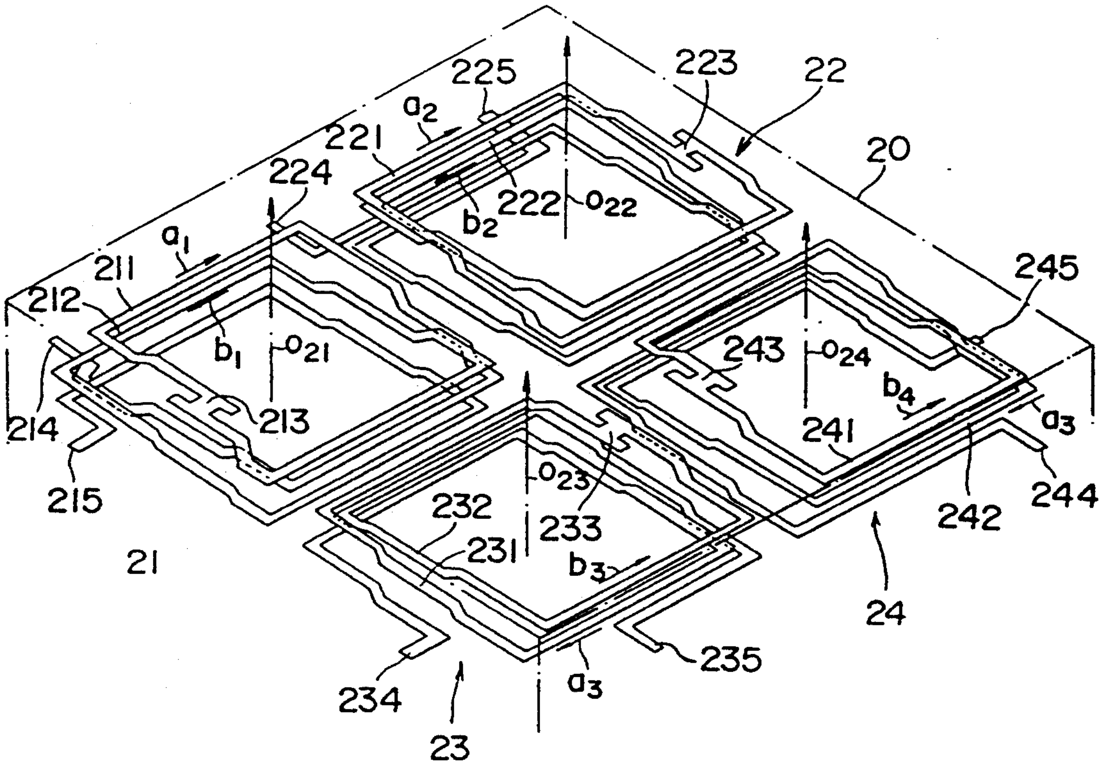

In the case of the instant embodiment, the other coils 22 to 24 are implemented basically similarly to the coil 21 and constituted by combinations of the coil conductors 211; 222, . . . , 241; 242, respectively, with the winding directions $a_2$; $b_2$, $a_3$; $b_3$ and $a_4$; $b_4$ being opposite to each other, respectively, wherein the respective winding axes coincide substantially with each another, and wherein the individual coil conductors of the coils 22 to 24 are connected, respectively, such that magnetic fields of a same direction are generated. Although the coils 23 and 24 share in common the terminal 25, they may have respective terminals, as is illustrated in FIG. 7 which shows a version of the embodiment shown in FIG. 6. It should further be mentioned that some of the coils 21 to 24 may be implemented equally by a single coil conductor.

Now, let's consider the coil 21 among others. It can be seen that the two coil conductors 211 and 212 constituting the coil 21 are so interconnected that the magnetic fields of a same direction are generated by them. Accordingly, the number N of turns of the coil is equal to a sum $(n_1+n_2)$ of the numbers of turns $n_1$ and $n_2$ of the two coil conductors 211 and 212, respectively. The inductance value L(H) of the coil is in proportion to a square of a sum of the numbers of turns n, as described hereinbefore. Thus, there can be realized an extremely high inductance value L.

Further, since the two coil conductors 211 and 212 are wound helically around the respective axes which coincide substantially with each other, as defined hereinbefore, both the coils are constituted by helical windings which are offset with a given pitch in the same direction. By virtue of this structure, the space and area occupied by the coil can be decreased to a minimum, whereby there can be realized a stacked multi-layer inductance element or pcart in a thin structure of a reduced size.

The coil conductors 211 and 212 are opposite to each other in respect to the winding directions $a_1$ and $b_1$, as view along the general winding axis $O_{21}$, wherein the trailing end portion of the coil conductor 211 and the leading end portion of the coil conductor 212 are disposed at a same level in a coplanar relation to each other so as to be easily interconnected by a connecting portion 213. Thus, the coil conductors 211 and 212 can be connected to each other interiorly of the magnetic material 20, which in turn means that the interconnection can be realized through much simplified and facilitated procedure.

The other coils 22 to 24 can be constructed in the same manner as described above. At this juncture, it should further be mentioned that the coil assembly shown in FIG. 6 may easily be constituted by the individual coils each composed of a greater number of the coil conductors such as described previously in conjunction with FIG. 5 without departing from the spirit and scope of the invention.

Now, referring to FIGS. 8 to 22, description will be made of a method or process for manufacturing the coil layer of the stacked multi-layer composite electric part according to the invention. Although the following description is made in conjunction with a manufacturing method based on a known lamination process such as disclosed in Japanese Patent Publication No. 39521/1982, it should be understood that there may equally be adopted other film forming techniques such as high-precision patterning technique known as photolithography, sputtering, evaporation, plating or the like. When these methods are adopted, a coil assembly incorporating coil conductors in a higher definition pattern can be implemented in a structure including a greater number of layers.

Figure 8:
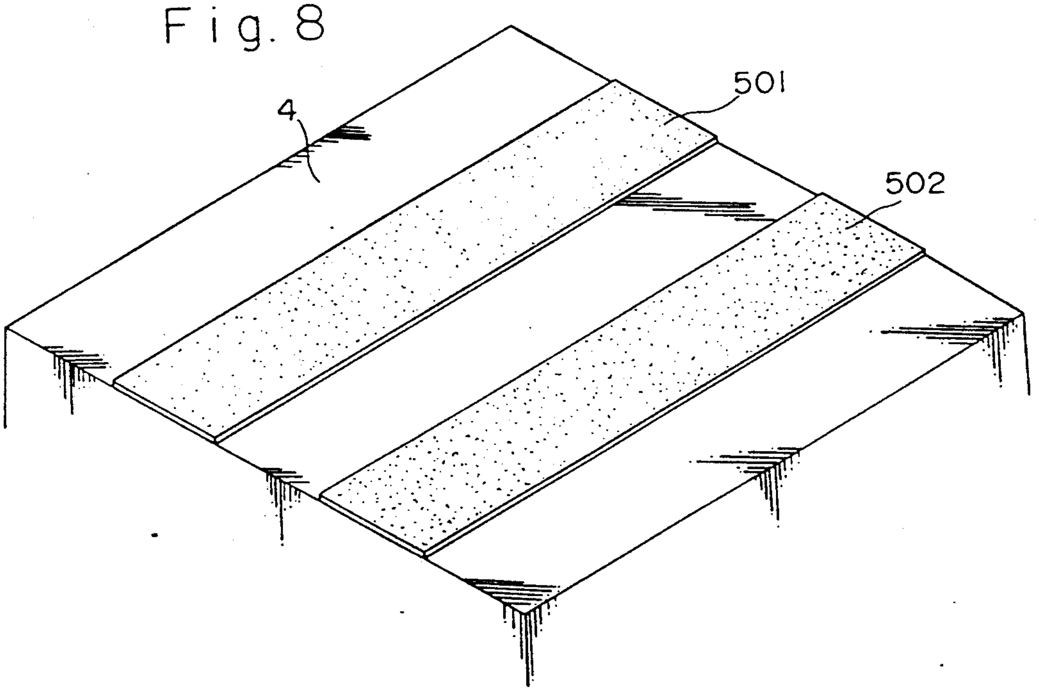
FIGS. 8 to 22 are views for illustrating, by way of example only, a manufacturing process of an electric part of a stacked layer stacked structure according to an embodiment of the present invention.

Now referring to FIG. 8, magnetic layers 501 and 502 are applied by printing over a surface of a substrate 4 with a space therebetween. More specifically, the magnetic layers 501 and 502 can be formed in a predetermined pattern by applying through a screen printing process a magnetic paste prepared by mixing together pulverized ferrite, a binder and a solvent.

Figure 9:
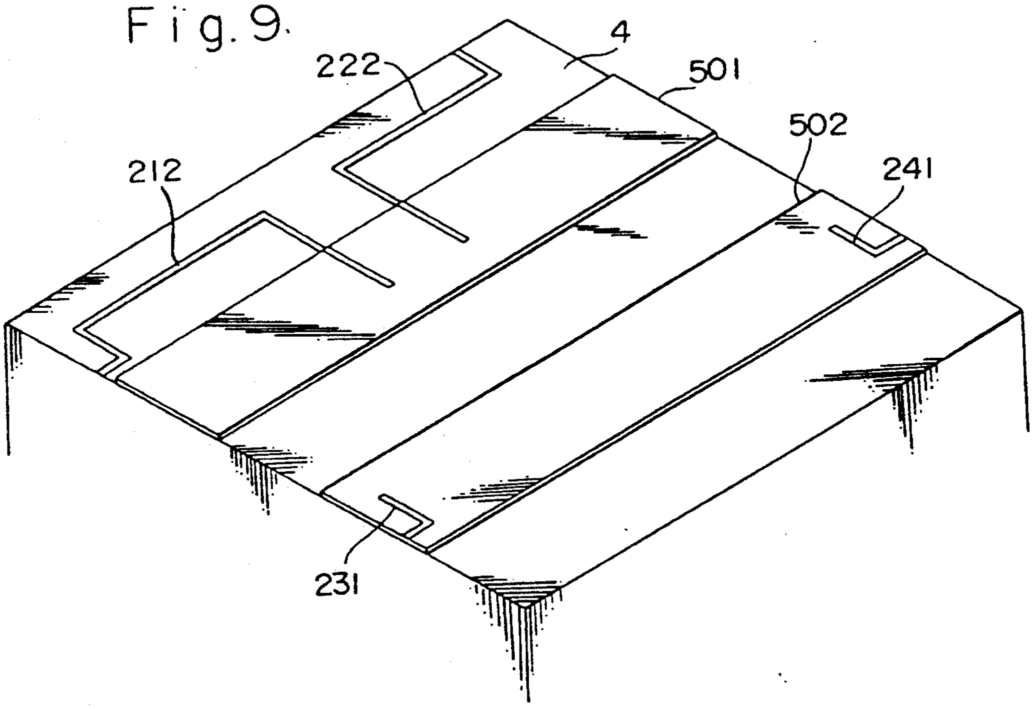

Subsequently, electric conductors 212, 222, 231 and 241 which are to constitute coil conductors are formed on the magnetic layers 501 and 502, as shown in FIG. 9. To this end, a screen printing of an electrically conductive paste may be resorted to.

Figure 10:
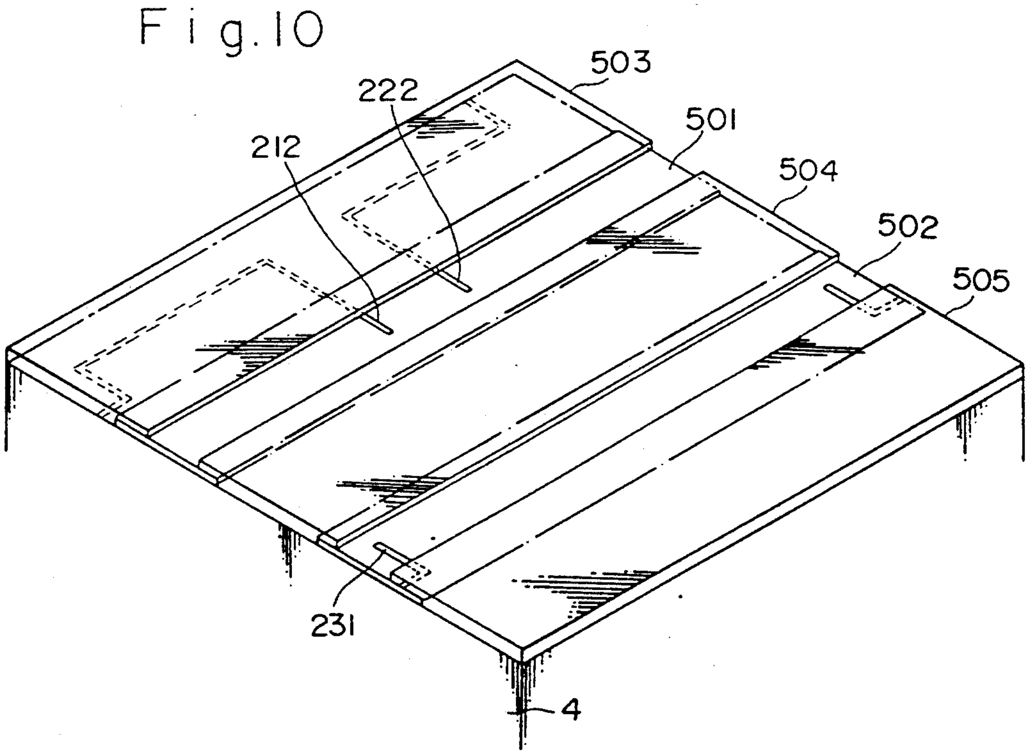

Next, magnetic layers 503 to 505 are formed in such a manner as to cover the spaces between the magnetic layers 501 and 502 with end portions of the conductors 212, 222, 231 and 241 being exposed, as can be seen in FIG. 10.

Figure 11:
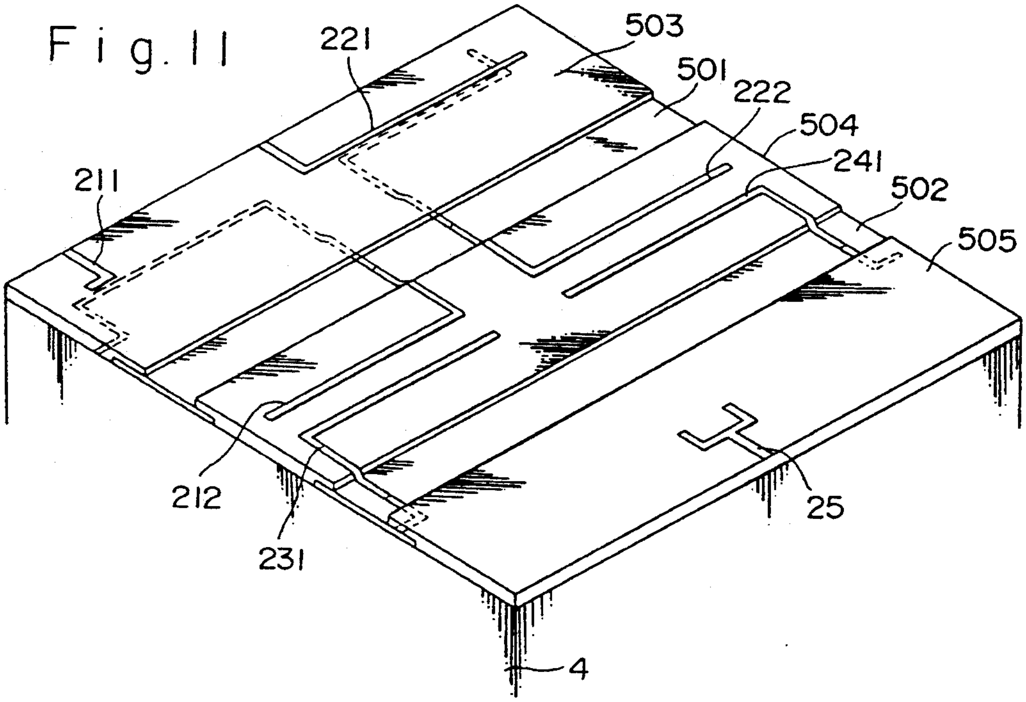

Referring now to FIG. 11, other electrical conductors 212, 222, 231 and 241 which are also destined to constitute the coil conductors are next printed in continuation to the exposed end portions of the conductors 212, 222, 231 and 241 on the magnetic layer 504, while electrical conductors 211 and 222 are printed on the magnetic layer 503 with a conductor 25 being printed on the magnetic layer 505.

Figure 12:
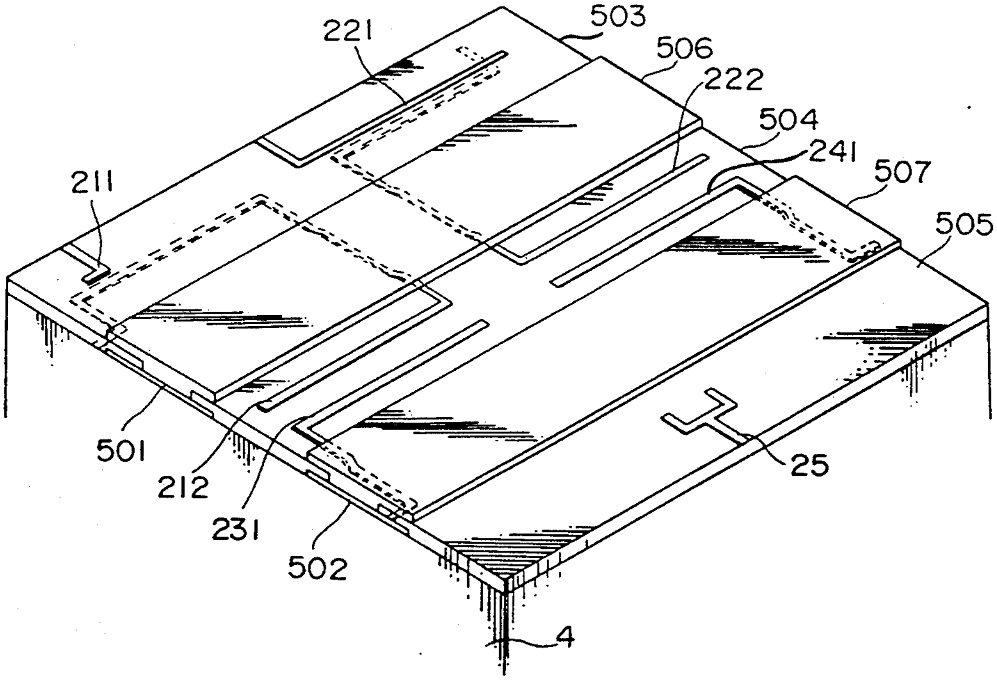

Subsequently, magnetic layers 506 and 507 are so printed as to fill the gaps making appearance among the magnetic layers 503 to 505, as is illustrated in FIG. 12.

Figure 13:
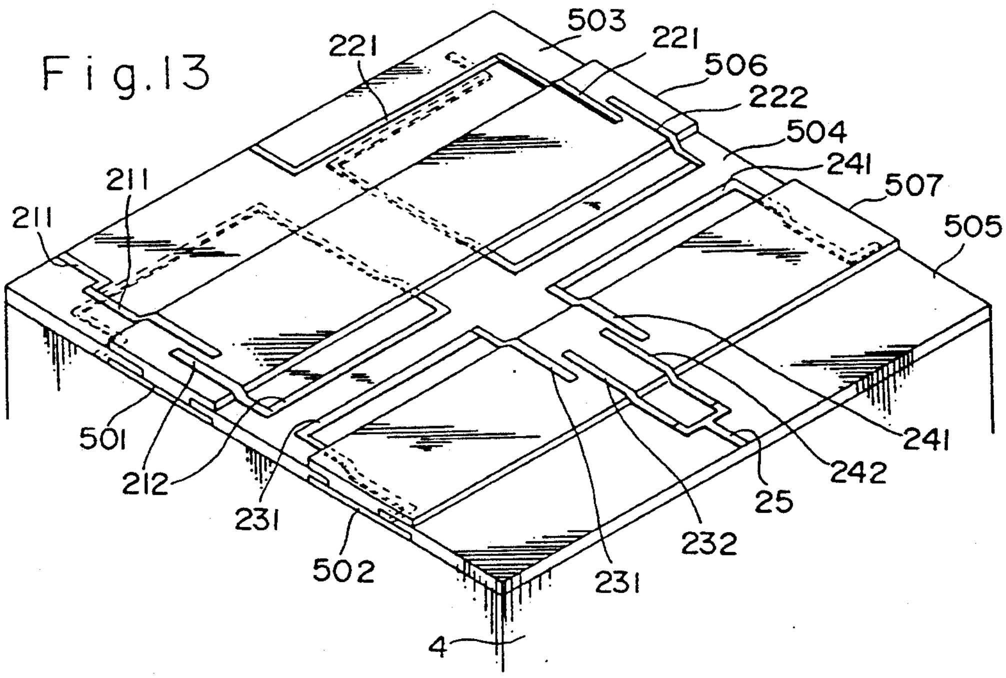
Figure 14:
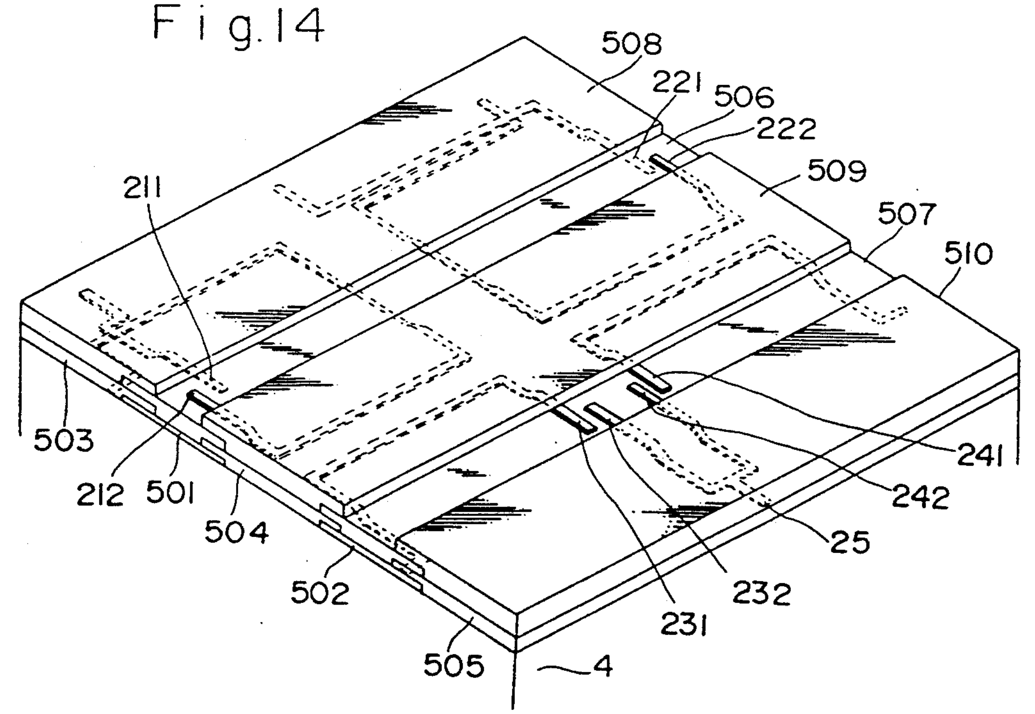
Figure 15:
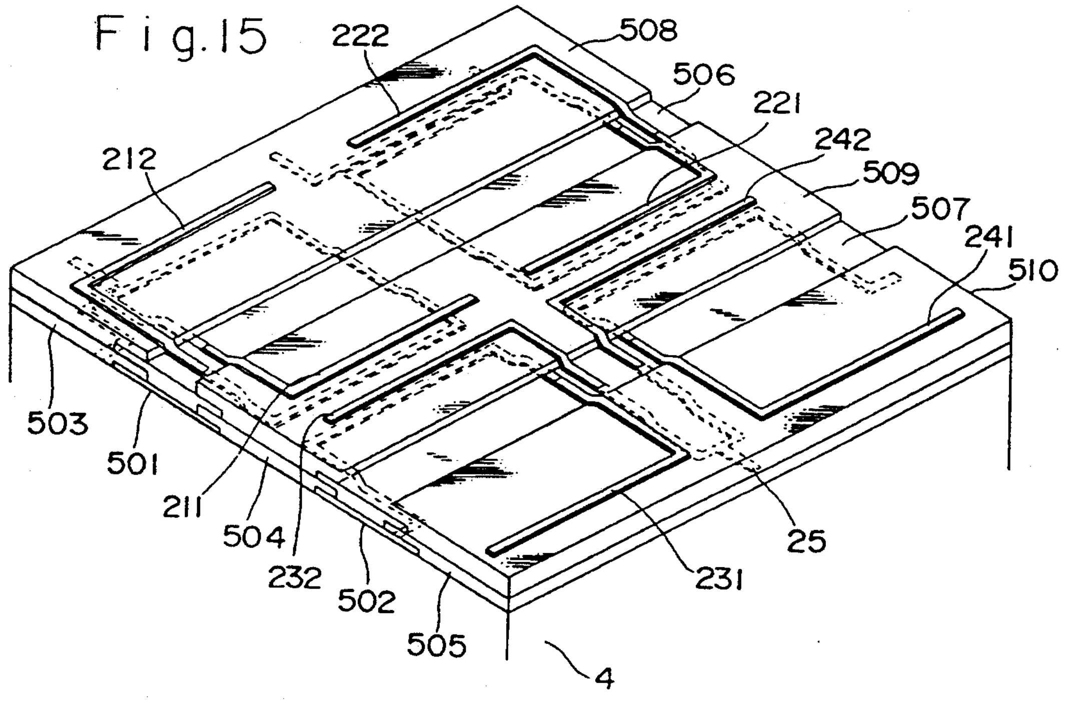
Figure 16:
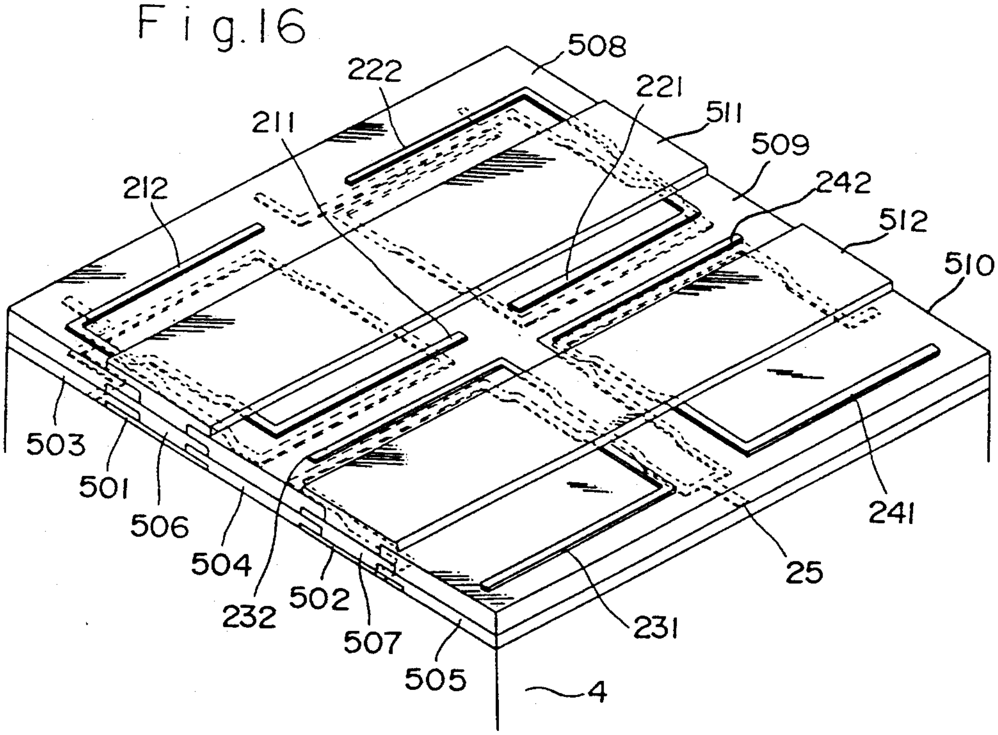
Figure 17:
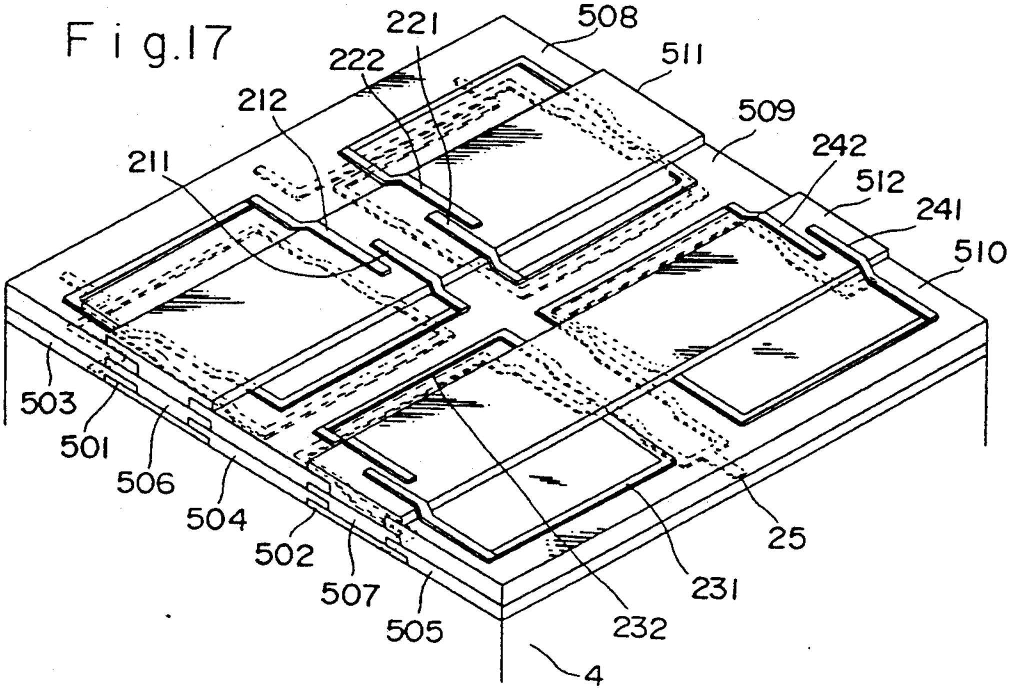
Figure 18:
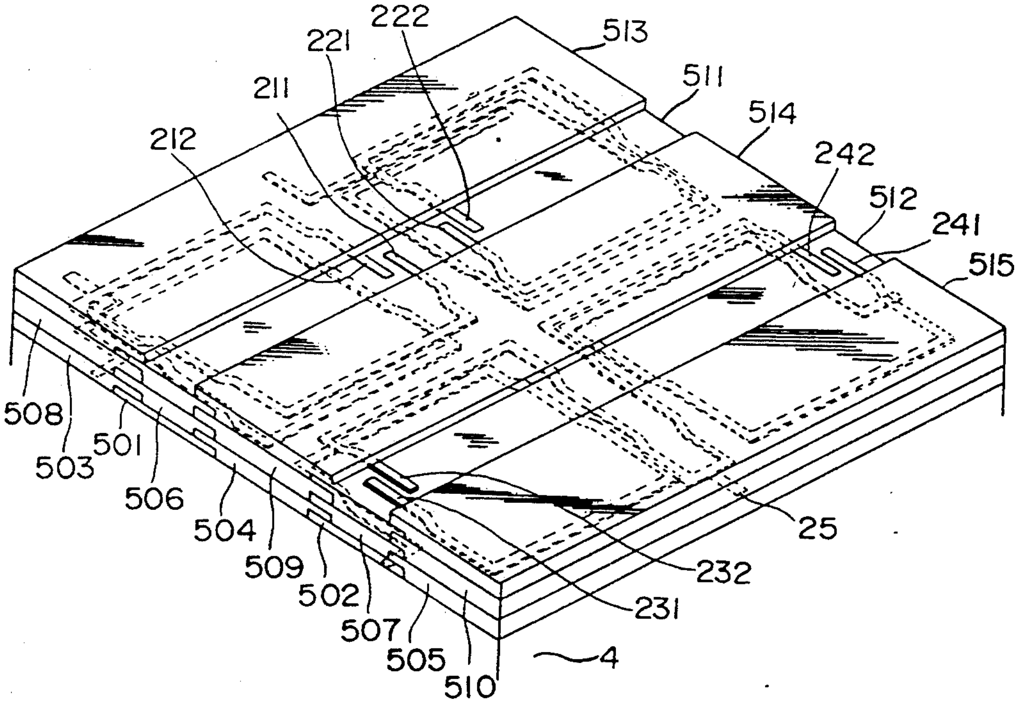
Figure 19:
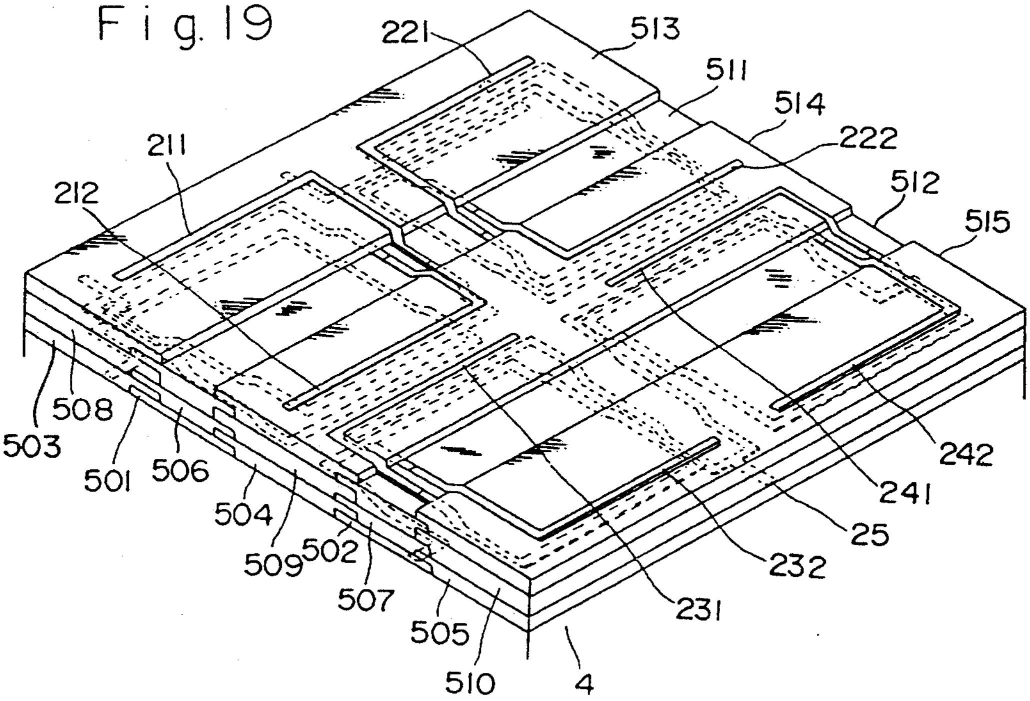
Figure 20:
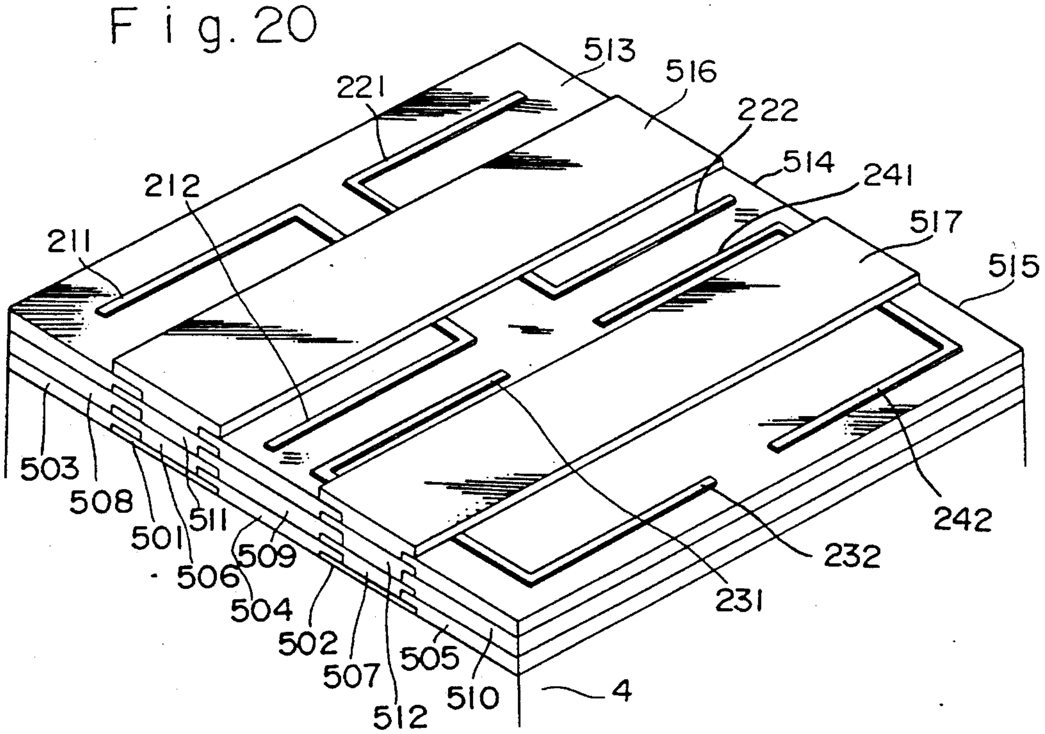
Figure 21:
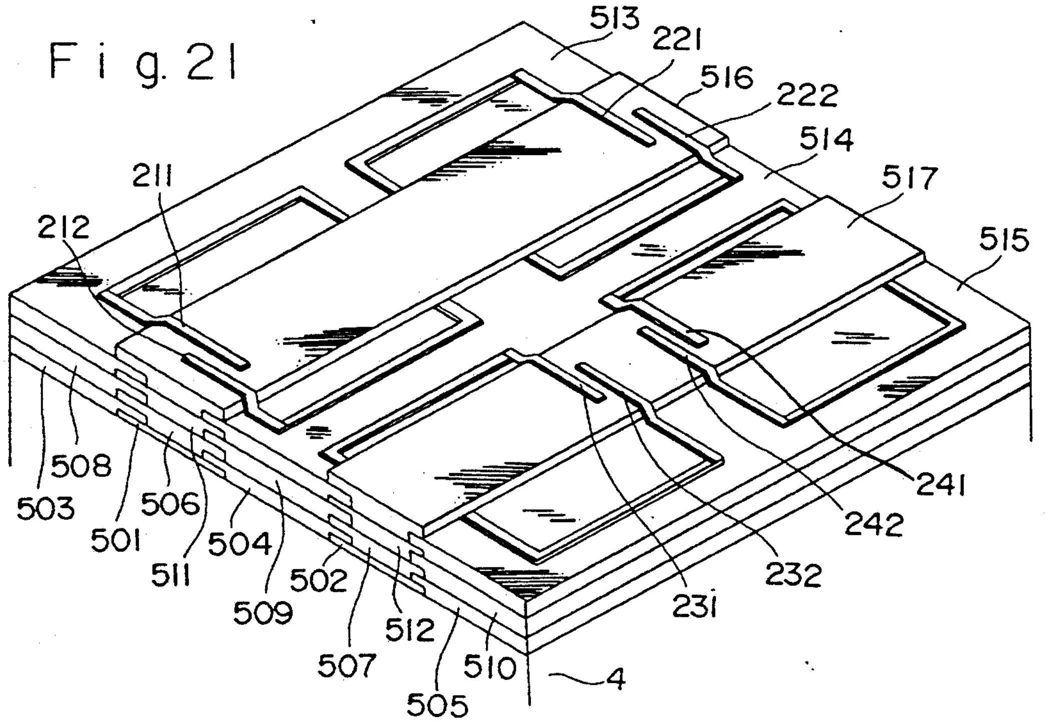

Further, as shown in FIG. 13, electrical conductors 211 and 221 are formed, respectively, on the magnetic layers 503 and 506 in continuation to the conductors 211 and 221 formed already, while electrical conductors 212 and 222 are formed, respectively, on the magnetic layer 504 and 506 in continuation to the existing conductors 212 and 222. Additionally, electric conductors 231 and 241 are formed on the magnetic layers 504 and 507 in continuation to the conductors 231 and 241, respectively, which have already been formed on the magnetic layer 504. Further, electric conductors 232 and 242 are formed on the magnetic layers 505 and 507 in continuation to the conductor 505. It should be noted that the conductors 211 and 212, the conductors 221 and 222, the conductors 211 and 232 and the conductors 241 and 242 are, respectively, so formed that these paired conductors extend in the directions opposite to each other.

Subsequently, the printing process for connecting continuously conductors 211; 212 to 241; 242 which are to constitute the coil conductors described hereinbefore as well as that for forming the magnetic layers are repeated a number of times corresponding to a number of turns desired, as is illustrated in FIGS. 14 to 21, in which reference numerals 508 to 517 denote the magnetic layers, respectively.

Figure 22:
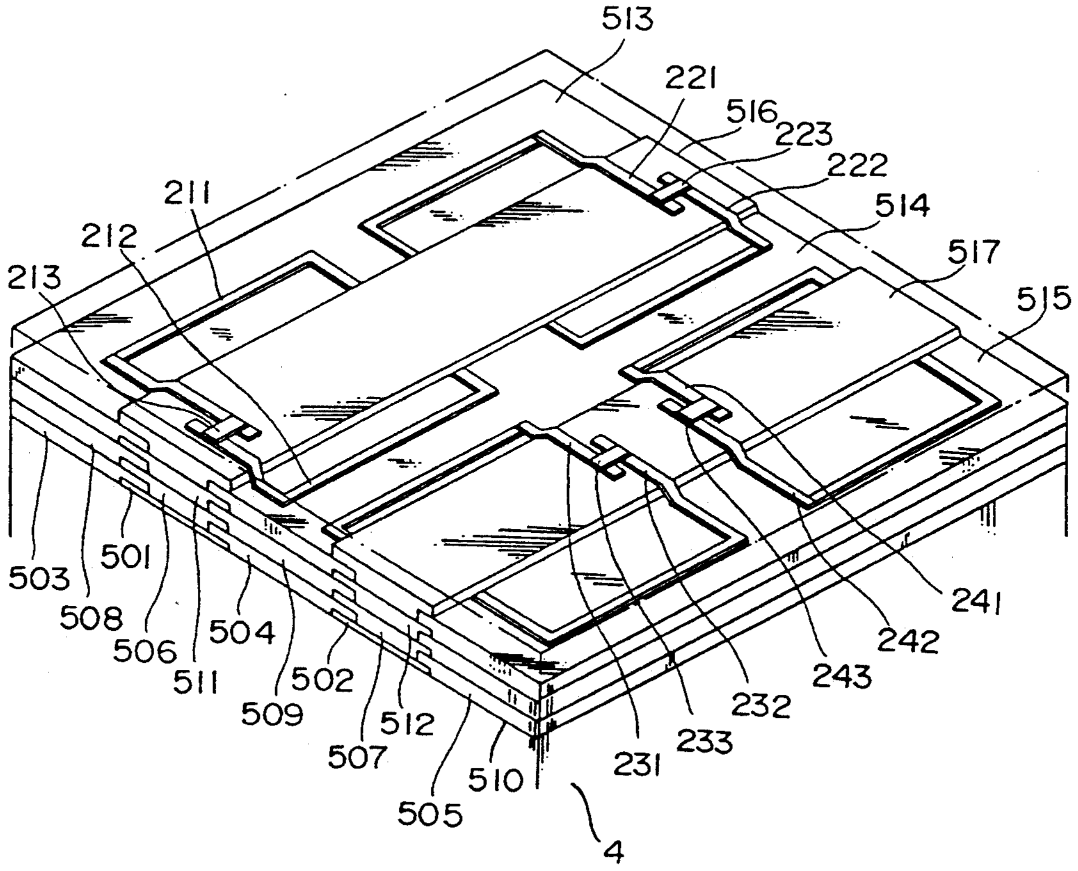

Finally, the coil conductors (211; 212), (221; 222), (231; 232) and (241; 242) each having a desired number of turns are connected together at the leading and trailing ends through connecting portions 213, 223, 233 and 243, respectively, as shown in FIG. 22. In this way, the inductor structure shown in FIG. 6 can be realized.

As will now be appreciated from the foregoing description, there can be achieved advantageous effects mentioned below according to the present invention.

(a) Because a plurality of coil conductors constituting a coil are mutually so connected that magnetic fields of a same direction are thereby generated, the number of turns of the whole coil corresponds to a sum of the numbers of turns of the individual coil conductors, whereby a stacked layer coil structure capable of exhibiting an extremely high inductance can be realized.

(b) Because a plurality of coil conductors are wound helically around the winding axes which are substantially coaxial to one another, there can be implemented a stacked layer coil structure and hence that of the composite electric part incorporating a space-saving coil of a reduced size having a high inductance value.

(c) Since each of the plural coil conductors includes a combination of two coil conductors wound in the directions opposite to each other when viewed in the direction along the general winding axis, wherein the trailing end portion of one coil conductor bears a coplanar relation to the eading end portion of the other coil conductor in the magnetic layer, interconnection or continuation of both coil conductors interiorly of the magnetic layer for allowing the magnetic fields of a same direction to be generated by these coil conductors can be realized extremely easily. Owing to this feature, there can be provided a composite electric part of stacked multi-layer structure which enjoys significantly improved coil performance.

Many features and advantages of the present invention are apparent from the detailed specification and thus it is intended by the appended claims to cover all such features and advantages of the system which fall within the true spirit and scope of the invention. Further, since numerous modifications and changes will readily occur to those skilled in the art, it is not desired to limit the invention to the exact construction and operation illustrated and described. Accordingly, all suitable modifications and equivalents may be resorted to, falling within the scope of the invention.

We claim:

1. A composite electric part of a stacked multi-layer structure composed of a capacitor layer and a coil layer, wherein said coil layer comprises:

at least one coil embedded in a magnetic material, in which said at least one coil comprises a stacked-layer structure formed by stacking plural sets of electrically conductive strips for forming plural sets of coils alternately with a plurality of electrically insulating members, wherein said electrically conductive strips in each of said sets are connected to the adjacent ones by way of edges of said electrically insulating members to thereby form a coil, a plurality of the coils thus formed wound about approximately a generally common axis, at least two of said plural sets of electrically conducting strips being stacked in layers and following spiral paths in directions opposite to each other, wherein the coils formed by said at least two sets of electrically conducting strips are connected to each other at least at a selected one of a leading end portion, an intermediate portion and a trailing end portion of said coil, whereby the magnetic fields generated by said coils are in the same direction.

2. A composite electric part of a stacked multi-layer structure according to claim 1, wherein a leading end of one of said coil conductors is positioned at a same level as a trailing end of the other coil conductor in a coplanar relation to each other.

* * * * *